United States Patent
Hu et al.

(10) Patent No.: US 9,293,586 B2
(45) Date of Patent: Mar. 22, 2016

(54) EPITAXIAL BLOCK LAYER FOR A FIN FIELD EFFECT TRANSISTOR DEVICE

(71) Applicant: GLOBALFOUNDRIES Inc., Grand Cayman (KY)

(72) Inventors: Zhenyu Hu, Clifton Park, NY (US); Richard J. Carter, Saratoga Springs, NY (US); Andy Wei, Queensbury, NY (US); Qi Zhang, Mechanicville, NY (US); Sruthi Muralidharan, Troy, NY (US); Amy L. Child, Wilton, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/944,048

(22) Filed: Jul. 17, 2013

(65) Prior Publication Data

US 2015/0021695 A1    Jan. 22, 2015

(51) Int. Cl.
*H01L 29/66* (2006.01)
*H01L 29/78* (2006.01)

(52) U.S. Cl.
CPC ........ *H01L 29/785* (2013.01); *H01L 29/66795* (2013.01)

(58) Field of Classification Search
CPC ................. H01L 21/823807; H01L 29/66545; H01L 29/7848; H01L 29/785
USPC .......... 257/192, 288, 368, 365; 438/212, 154, 438/299
See application file for complete search history.

(56) References Cited

U.S. PATENT DOCUMENTS

| | | | |
|---|---|---|---|
| 8,445,340 B2 | 5/2013 | Lee et al. | |
| 8,609,495 B2 | 12/2013 | Gan et al. | |
| 8,703,556 B2 | 4/2014 | Kelly et al. | |
| 8,796,759 B2 | 8/2014 | Perng et al. | |
| 2013/0105861 A1* | 5/2013 | Liao et al. | 257/192 |
| 2013/0146959 A1* | 6/2013 | Cheng | H01L 29/66181 257/310 |
| 2013/0157431 A1* | 6/2013 | Tsai | H01L 29/66545 438/299 |
| 2014/0065782 A1 | 3/2014 | Lu et al. | |
| 2014/0106523 A1* | 4/2014 | Koldiaev et al. | 438/212 |
| 2014/0145242 A1* | 5/2014 | Huang | H01L 21/823807 257/192 |
| 2014/0203338 A1 | 7/2014 | Kelly et al. | |
| 2014/0273429 A1 | 9/2014 | Wei et al. | |

OTHER PUBLICATIONS

Brewer; "Understanding Brewer Science's Bottom Anti-Reflective Coatings," 2002, ARC; slides 1-24.*

* cited by examiner

*Primary Examiner* — Kenneth Parker
*Assistant Examiner* — Bo Fan
(74) *Attorney, Agent, or Firm* — Williams Morgan, P.C.

(57) ABSTRACT

Approaches for enabling uniform epitaxial (epi) growth in an epi junction area of a semiconductor device (e.g., a fin field effect transistor device) are provided. Specifically, a semiconductor device is provided including a dummy gate and a set of fin field effect transistors (FinFETs) formed over a substrate; a spacer layer formed over the dummy gate and each of the set of FinFETs; and an epi material formed within a set of recesses in the substrate, the set of recesses formed prior to removal of an epi block layer over the dummy gate.

6 Claims, 6 Drawing Sheets

US 9,293,586 B2

EPITAXIAL BLOCK LAYER FOR A FIN FIELD EFFECT TRANSISTOR DEVICE

BACKGROUND

1. Technical Field

This invention relates generally to the field of semiconductors, and more particularly, to forming an epitaxial (epi) block layer to increase uniformity during epi growth in a fin field effect transistor (FinFET) device.

2. Related Art

A typical integrated circuit (IC) chip includes a stack of several levels or sequentially formed layers of shapes. Each layer is stacked or overlaid on a prior layer and patterned to form the shapes that define devices (e.g., field effect transistors (FETs)) and connect the devices into circuits. In a typical state of the art complementary insulated gate FET process, such as what is normally referred to as CMOS, layers are formed on a wafer to form the devices on a surface of the wafer. Further, the surface may be the surface of a silicon layer on a silicon on insulator (SOI) wafer. A simple FET is formed by the intersection of two shapes, a gate layer rectangle on a silicon island formed from the silicon surface layer. Each of these layers of shapes, also known as mask levels or layers, may be created or printed optically through well known photolithographic masking, developing and level definition, e.g., etching, implanting, deposition and etc.

The fin-shaped field effect transistor (FinFET) is a transistor design that attempts to overcome the issues of short-channel effect encountered by deep submicron transistors, such as drain-induced barrier lowering (DIBL). Such effects make it harder for the voltage on a gate electrode to deplete the channel underneath and stop the flow of carriers through the channel—in other words, to turn the transistor off. By raising the channel above the surface of the wafer instead of creating the channel just below the surface, it is possible to wrap the gate around all but one of its sides, providing much greater electrostatic control over the carriers within it.

FinFET architecture typically takes advantage of self-aligned process steps to produce narrow features that are much smaller than the wavelength of light that is generally used to pattern devices on a silicon wafer. It is possible to create very thin fins (e.g., 20 nm in width or less) on the surface of a silicon wafer using selective-etching processes. The fin is used to form the raised channel. The gate is then deposited so that it wraps around the fin to form a trigate structure. As the channel is extremely thin, the gate typically has much greater control over the carriers within it. However, when the device is switched on, the gate shape limits the current through the gate to a low level. Consequently, multiple fins may be used in parallel to provide higher drive strengths.

In one prior art approach, as shown in FIG. 1, device 10 includes a dummy gate 12 covering an isolation trench oxide 14 between a pair of neighboring FinFETs 16A-B. Device 10 further comprises an epitaxial source 18 and drain 20 formed within a substrate 22, and spacers 24 formed along finFETs 16A-B and dummy gate 12. However, patterning isolation trench 14 to reach the small critical dimensions (CD) required is difficult with conventional lithography and etch techniques available. Device 10 suffers from leakage between the S/D through the dummy gate 12.

Furthermore, as shown in FIG. 2, during actual formation, isolation trench 14 is larger than dummy gate 12, and the epitaxy (epi) of source 18 and drain 20 grows non-ideally, which results in asymmetric growth without ideal facets, as well as insufficient tensile stress applied to the transistor channel. This is especially problematic when trying to land source and drain contacts on the epi of source 18 and drain 20. In this case, the contact area will not be positioned as high as desired, which may result in current crowding issues. What's more, the structure of device 10 still provides a potential leakage path through dummy gate 12.

SUMMARY

In general, approaches for enabling uniform epitaxial (epi) growth in an epi junction area of a semiconductor device (e.g., a fin field effect transistor device) are provided. Specifically, a semiconductor device is provided including a dummy gate and a set of fin field effect transistors (FinFETs) formed over a substrate; a spacer layer formed over the dummy gate and each of the set of FinFETs; and an epi material formed within a set of recesses in the substrate, the set of recesses formed prior to removal of an epi block layer over the dummy gate.

One aspect of the present invention includes a method for forming a device, the method comprising: forming a set of fin field effect transistors (FinFETs) over a substrate; forming a spacer layer over each of the set of FinFETs; forming an epitaxial (epi) block layer over one of the FinFETs; removing a portion of the spacer layer in an epi junction area adjacent the one of the FinFETs; forming a set of recesses in the substrate in the epi junction area adjacent the one of the FinFETs; and forming an epi material within the set of recesses.

Another aspect of the present invention includes a method for enabling uniform epitaxial (epi) growth in an epi junction area of a semiconductor device, the method comprising: forming a dummy gate and a set of fin field effect transistors (FinFETs) over a substrate; forming a spacer layer over each of the set of FinFETs; forming an epitaxial (epi) block layer over one of the FinFETs; removing a portion of the spacer layer in an epi junction area adjacent the one of the FinFETs; forming a set of recesses in the substrate in the epi junction area adjacent the one of the FinFETs; and forming an epi material within the set of recesses.

Yet another aspect of the present invention includes a semiconductor device, the device comprising: a dummy gate and a set of fin field effect transistors (FinFETs) formed over a substrate; a spacer layer formed over the dummy gate and each of the set of FinFETs; and an epi material formed within a set of recesses in the substrate, the set of recesses formed prior to removal of an epi block layer and a portion of the spacer layer in an epi junction area adjacent the dummy gate.

BRIEF DESCRIPTION OF THE DRAWINGS

These and other features of this invention will be more readily understood from the following detailed description of the various aspects of the invention taken in conjunction with the accompanying drawings in which.

Figure 1:
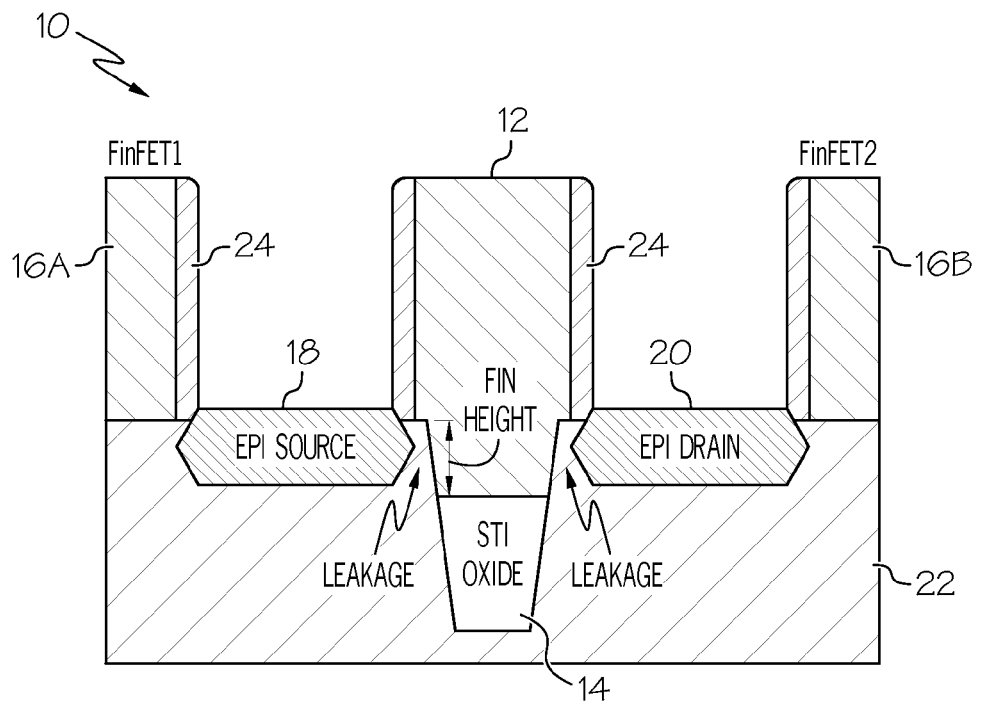
FIG. 1 shows a cross-sectional view of a prior art semiconductor device.
Figure 2:
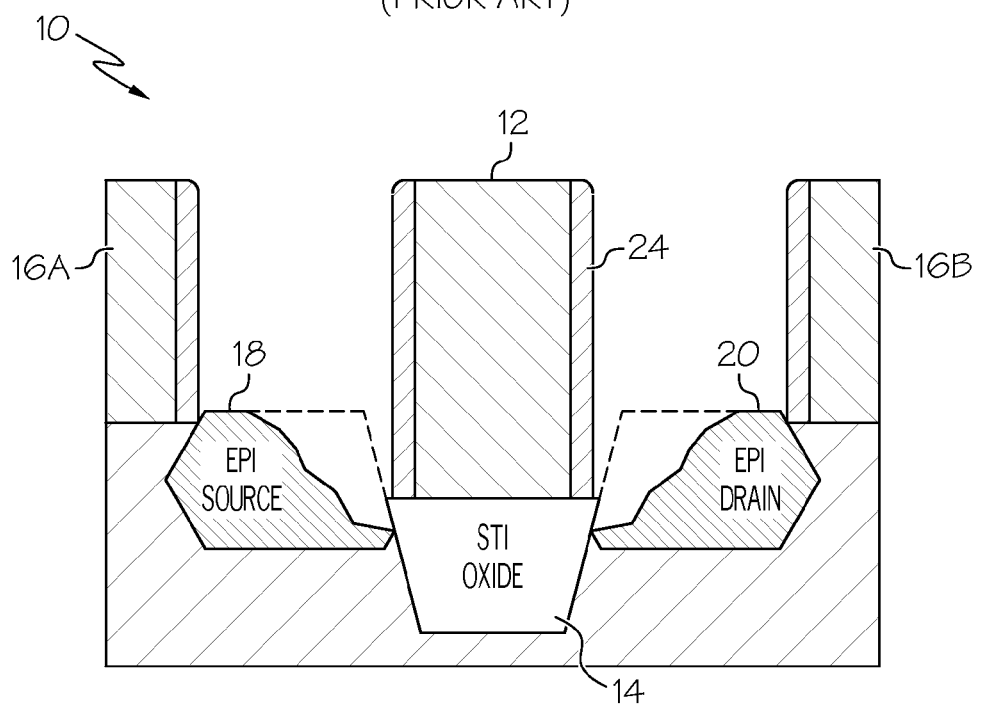
FIG. 2 shows a cross-sectional view of the prior art semiconductor device.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. Described are approaches for enabling uniform epitaxial (epi) growth in an epi junction area of a semiconductor device (e.g., a fin field effect transistor device). Specifically, a semiconductor device is provided including a dummy gate and a set of fin field effect transistors (FinFETs) formed over a substrate; a spacer layer formed over the dummy gate and each of the set of FinFETs; and an epi material formed within a set of recesses in the substrate, the set of recesses formed prior to removal of an epi block layer over the dummy gate.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 3:
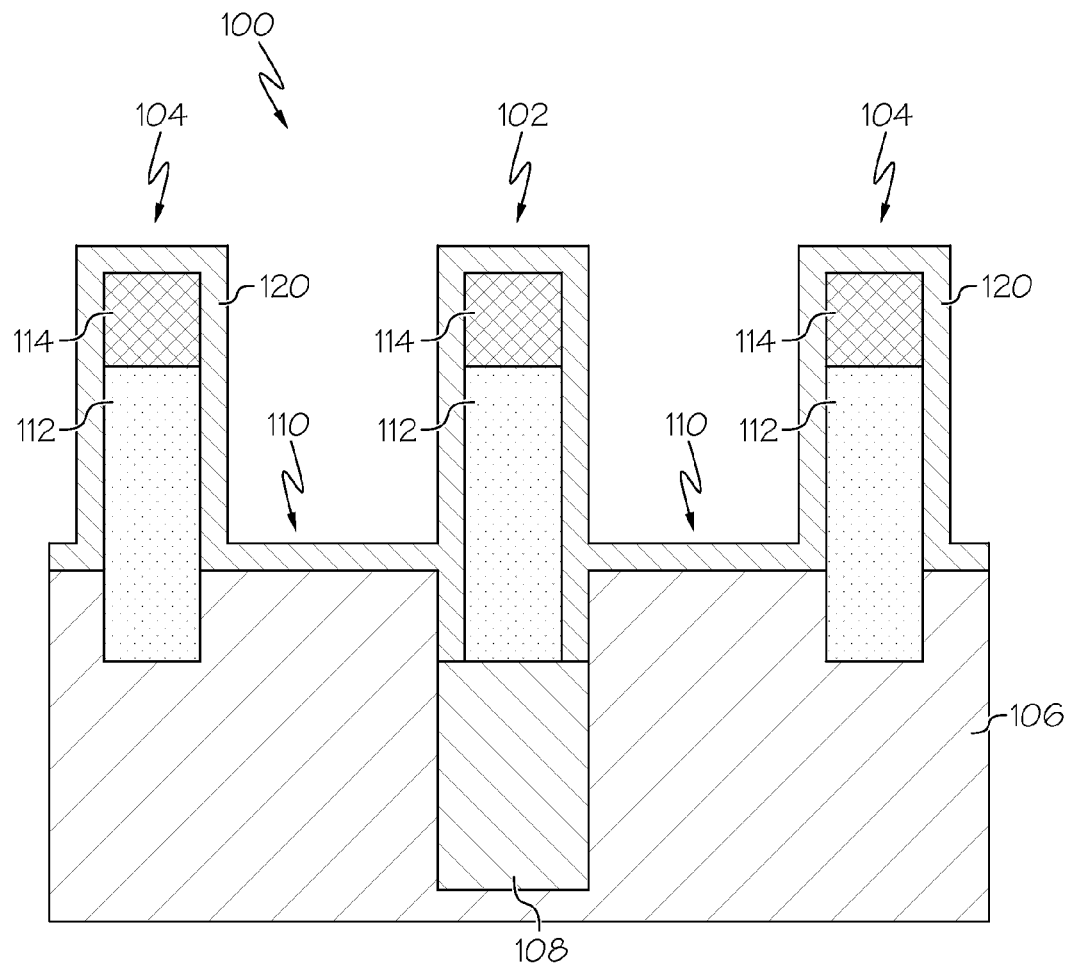
FIG. 3 shows a cross-sectional view of a semiconductor device including a dummy gate and a set of FinFETs according to illustrative embodiments.

With reference again to the figures, FIG. 3 shows a cross sectional view of a device 100 according to an embodiment of the invention. Device 100 comprises a sacrificial FinFET (i.e., a dummy gate) 102 and a set of FinFETs 104 formed over a substrate 106. Device 100 further comprises a shallow trench isolation (STI) oxide 108 within substrate 106, as shown beneath dummy gate 102. STI oxide 108 may include any suitable insulating material.

Furthermore, device 100 comprises epi junction areas 110 located over substrate 106 and adjacent dummy gate 102. Dummy gate 102 and FinFETs 104 are formed over a set of fins patterned from substrate 106. In one embodiment, substrate 106 includes a silicon substrate (e.g., wafer). The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

Dummy gate 102 and FinFETs 104 may be fabricated using any suitable process including one or more photolithography and etch processes. The photolithography process may include forming a photoresist layer (not shown) overlying substrate 106 (e.g., on a silicon layer), exposing the resist to a pattern, performing post-exposure bake processes, and developing the resist to form a masking element including the resist. The masking element may then be used to etch dummy gate 102 and FinFETs 104 into the silicon layer, e.g., using reactive ion etch (RIE) and/or other suitable processes.

In one embodiment, dummy gate 102 and FinFETs 104 are formed by a double-patterning lithography (DPL) process. DPL is a method of constructing a pattern on a substrate by dividing the pattern into two interleaved patterns. DPL allows enhanced feature (e.g., fin) density. In this embodiment, dummy gate 102 and FinFETs 104 each include a gate electrode 112. Numerous other layers may also be present, for example, a gate dielectric layer, a capping layer 114 (e.g., SiN), interface layers, and/or other suitable features. The gate dielectric layer may include dielectric material such as, silicon oxide, silicon nitride, silicon oxinitride, dielectric with a high dielectric constant (high k), and/or combinations thereof. Examples of high k materials include hafnium silicate, hafnium oxide, zirconium oxide, aluminum oxide, hafnium dioxide-alumina ($HfO_2$—$Al_2O_3$) alloy, and/or combinations thereof. The gate dielectric layer may be formed using processes such as, photolithography patterning, oxidation, deposition, etching, and/or other suitable processes. Gate electrode 112 may include polysilicon, silicon-germanium, a metal including metal compounds such as, Mo, Cu, W, Ti, Ta, TiN, TaN, NiSi, CoSi, and/or other suitable conductive materials known in the art. Gate electrode 112 may be formed using processes such as, physical vapor deposition (PVD), CVD, plasma-enhanced chemical vapor deposition (PECVD), atmospheric pressure chemical vapor deposition (APCVD), low-pressure CVD (LPCVD), high density plasma CVD (HD CVD), atomic layer CVD (ALCVD), and/or other suitable processes which may be followed, for example, by photolithography and/or etching processes.

Next, as also shown in FIG. 3, a spacer layer 120 is formed over device 100, including over gate electrode 112, capping layer 114, and the fin (e.g., in epi junction area 110). As further shown, spacer layer 120 extends down gate electrode 112 of dummy gate 102 to a top surface of STI oxide 108. In one embodiment, spacer layer 120 comprises an insulating material, e.g., $Si_3N_4$. Depending on implementation, spacer layer 120 may be deposited by way of plasma-enhanced chemical vapor deposition (PE-CVD) to a desired thickness.

Figure 4:
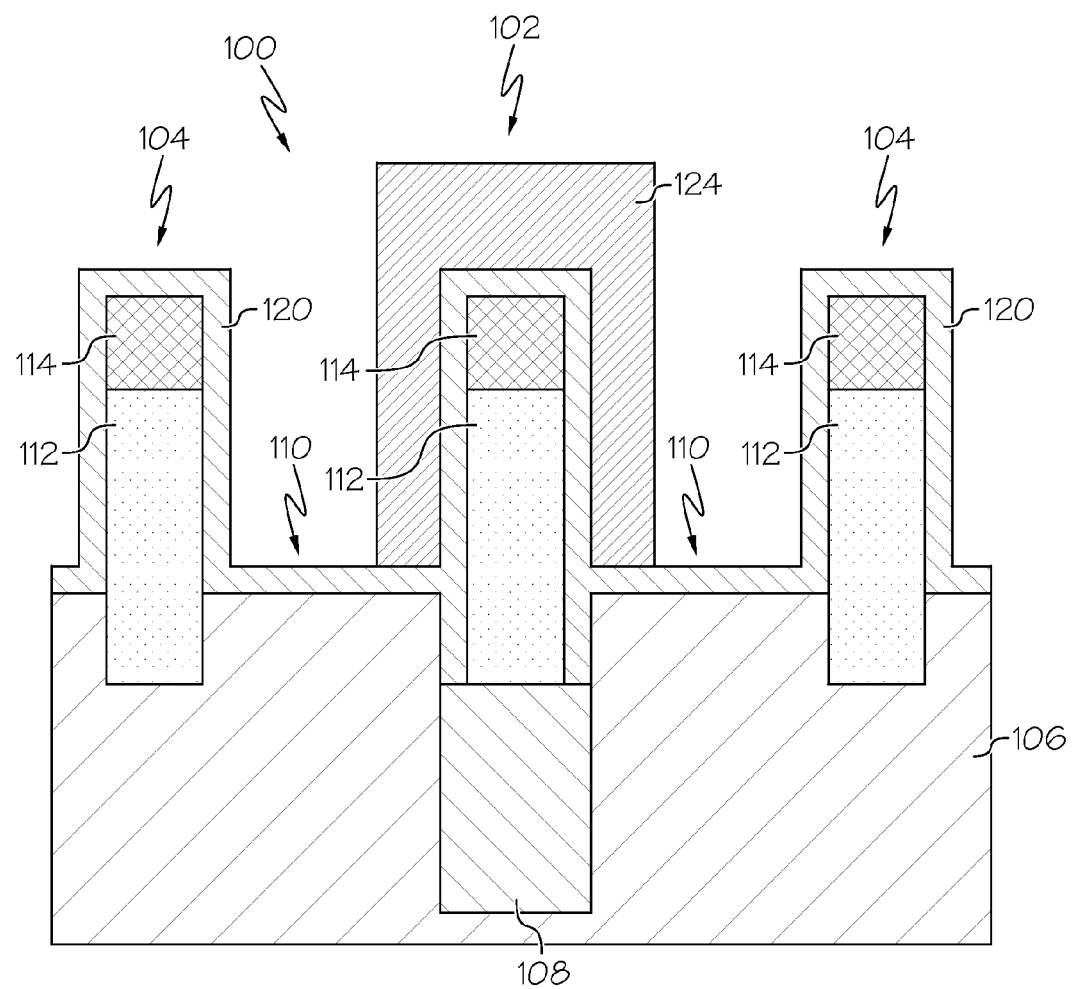
FIG. 4 shows a cross-sectional view of a processing step for forming an epi block layer over a dummy gate in a semiconductor device according to illustrative embodiments.

An epi block layer 124 is then formed over dummy gate 102, as shown in FIG. 4. In this embodiment, epi block layer 124 is formed over a top surface and both sidewall surfaces of dummy gate 102. Epi block layer 124 has a thickness along each sidewall sufficient to protect a portion of spacer layer 120 extending perpendicularly from dummy gate 102 in each epi junction area 110. In one embodiment, epi block layer 124 is formed using an antireflective film (ArF) photoresist. That is, epi block layer 124 may be formed on an antireflective coating layer (not shown) to form a predetermined pattern such as a block over a gate pattern. Organic materials may be used as the antireflective coating layer, and the ArF photoresist may be any polymer of a COMA (CycloOlefin-Maleic Anhydride), acrylate system and a mixture thereof. In one embodiment, epi block layer 124 comprises an Optical Planarizing Layer (OPL), a photo resist, or a-C.

Figure 5:
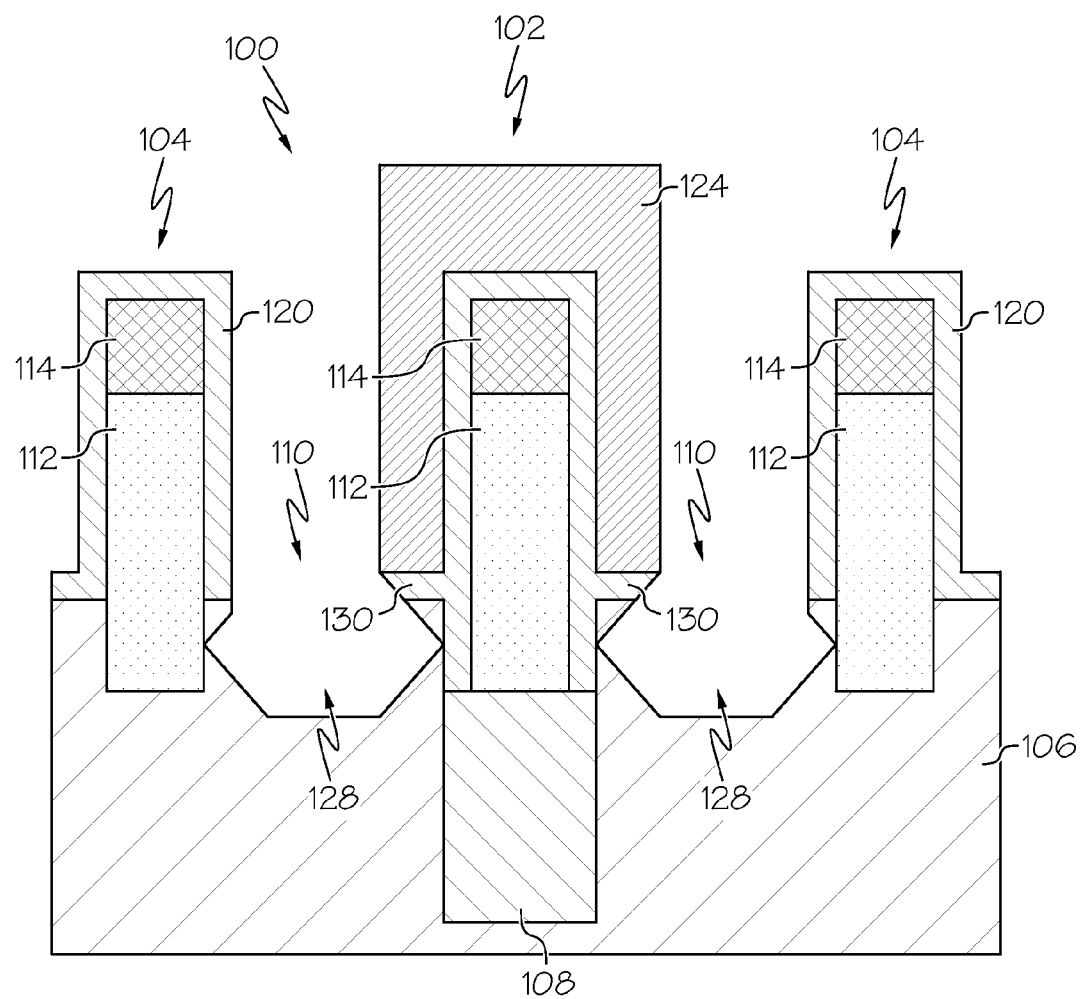
FIG. 5 shows a cross-sectional view of a processing step for forming a set of recesses in the semiconductor device according to illustrative embodiments.
Figure 6:
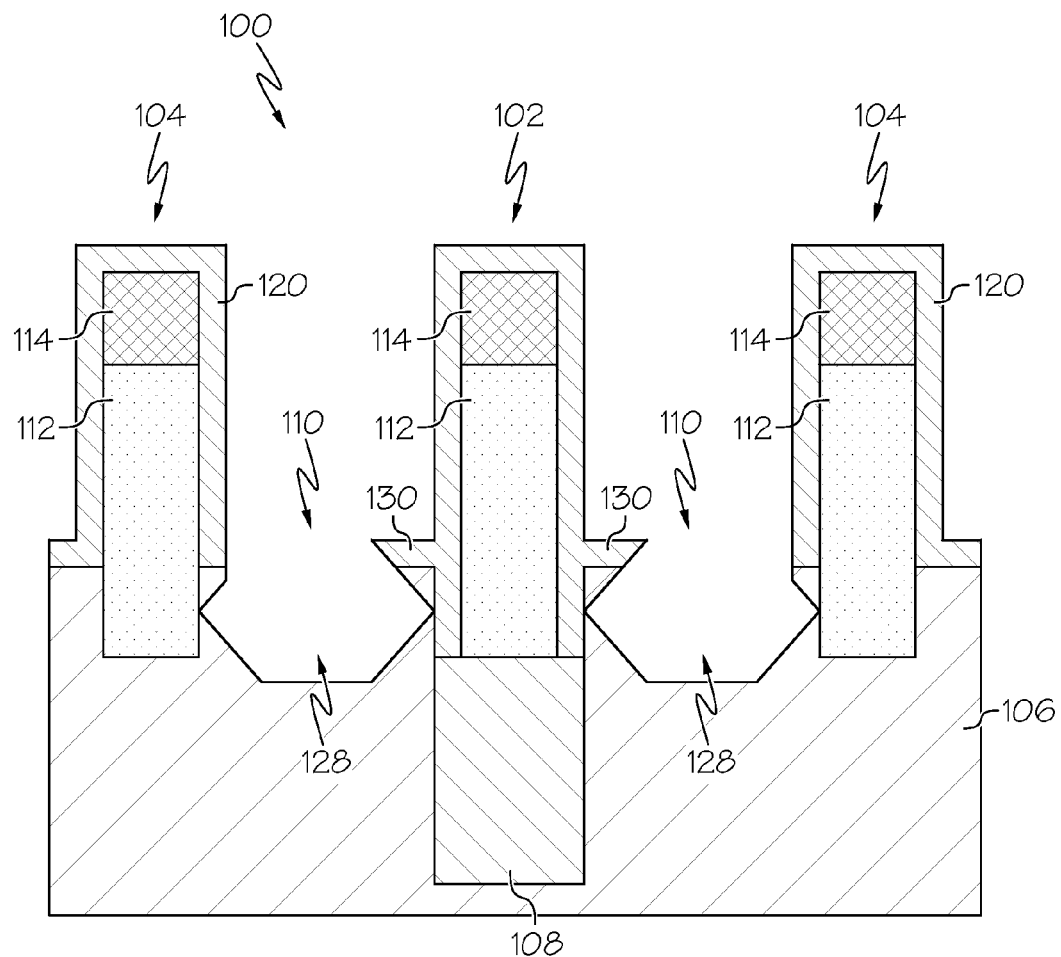
FIG. 6 shows a cross-sectional view of the semiconductor device following removal of the epi block layer according to illustrative embodiments.
Figure 7:
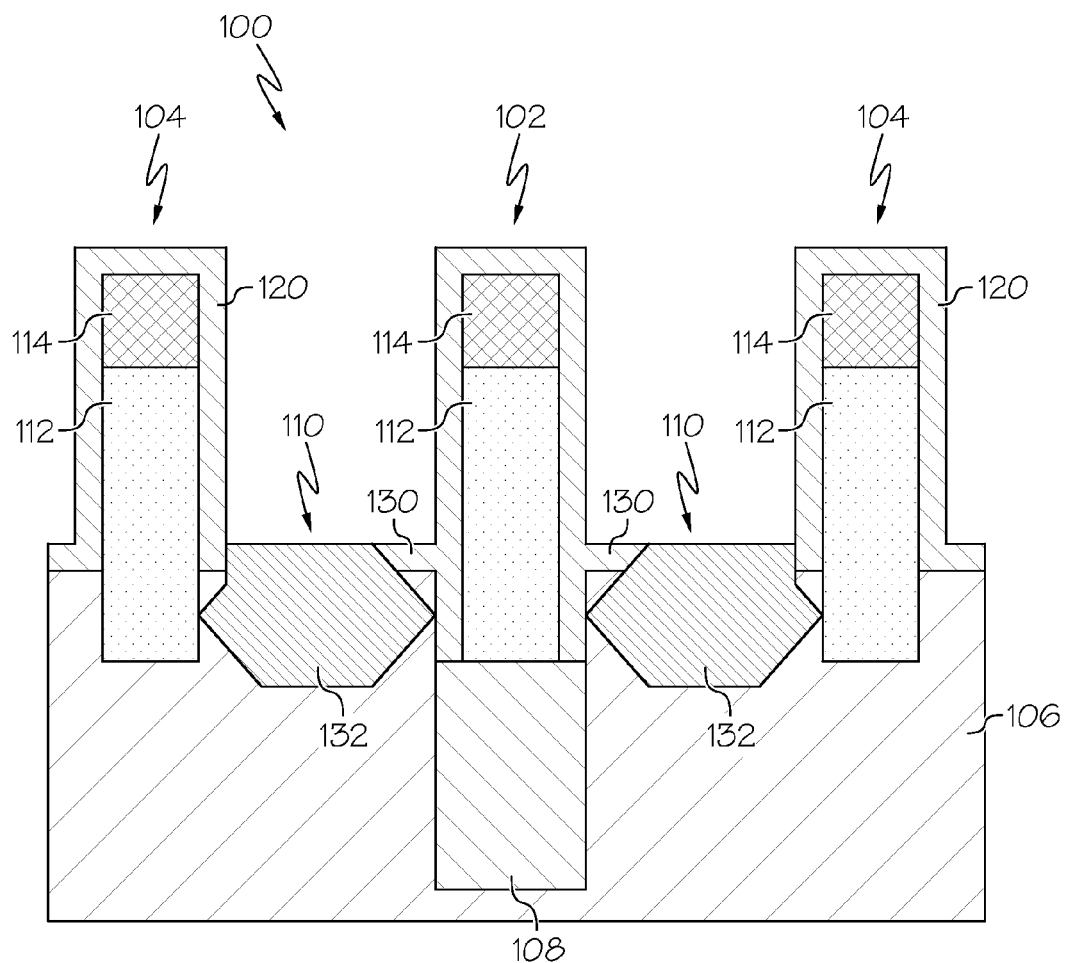
FIG. 7 shows a cross-sectional view of a processing step for forming an epi material in the set of recesses in the semiconductor device according to illustrative embodiments.

Next, as shown in FIG. 5, a set of recesses 128 are formed within substrate 106 in epi junction areas 110 (i.e., between dummy gate 102 and each FinFET 104). As shown, recesses 128 are formed (e.g., via reactive ion etching, NH4OH wet etch) prior to removal of epi block layer 124, thus preserving dummy gate 102 and a portion 130 of spacer layer 120 extending horizontally from dummy gate 102 in each epi junction area 110. Once epi block layer 124 is removed, as shown in FIG. 6, an epi material 132 is formed within each recess 128 (FIG. 7). In this embodiment, epi material 132 comprises epitaxial silicon (e-Si), which is grown in recesses 128, and may be in-situ boron (B) doped, such as to a concentration of approximately 1e18 to 1e19 atoms/cm2. Note that this doping is "p", or electron acceptor, the same as the well. Other p-types, such as indium (In) could be used. In another embodiment, epi material 132 comprises silicon-germanium (SiGe) or silicon-phosphorus (SiP), wherein Ge or P can vary in concentration to achieve different device performance. Furthermore, a top and bottom portion of EPI material 132 formed within recesses 128 may have different Ge or P concentrations. Although the epi-Si "fill" material is shown extending only to a top surface of spacer layer 120, it could extend higher, beyond this surface. In this case, epi material 132 is etched, to remove substantially all of the doped epi-Si material 132 except for the portions that remain in recesses 128, as shown in FIG. 7. Once completed, this process and resulting structure results in uniform growth of epi material 132 in junction areas 110 of device 100.

In various embodiments, design tools can be provided and configured to create the datasets used to pattern the semiconductor layers as described herein. For example data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided device isolation in a complimentary metal-oxide fin field effect transistor. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A device, comprising:
   a dummy gate and a set of fin field effect transistors (FinFETs) over a substrate, wherein the tops of the dummy gate and the set of FinFETs define a first portion of the horizontal surface of the device;
   a continuous spacer layer over the dummy gate, each of the set of FinFETs, and a second portion of the horizontal surface of the device;

a set of recesses in the substrate, and a source and drain epi material within the set of recesses in the substrate, wherein the tops of the epi material within the set of recesses define a third portion of the horizontal surface of the device.

2. The device according to claim 1, the epi material comprising an epi silicon.

3. The device according to claim 1, wherein the spacer layer is formed by forming the spacer layer over more than the second portion of the horizontal surface of the device; forming an antireflective coating layer over the second portion of the horizontal surface of the device; and forming an epi block layer over the antireflective coating layer; and wherein the set of recesses is formed after removal of the spacer layer from over portions of the horizontal surface of the device other than the second portion and before removal of the epi block layer.

4. The device according to claim 1, further comprising a shallow trench isolation oxide within the substrate.

5. The device according to claim 1, wherein a portion of the spacer layer is substantially horizontal.

6. The device according to claim 1, wherein the spacer layer is formed by depositing an insulating material over the device using chemical vapor deposition.

* * * * *